United States Patent [19]

Kanehachi

[11] Patent Number: 5,384,274
[45] Date of Patent: Jan. 24, 1995

[54] METHOD OF MAKING A COMBINED SEMICONDUCTOR DEVICE AND INDUCTOR

[75] Inventor: Kaoru Kanehachi, Tokyo, Japan

[73] Assignee: Nippon Precision Circuits Inc., Tokyo, Japan

[21] Appl. No.: 241,946

[22] Filed: May 12, 1994

Related U.S. Application Data

[63] Continuation of Ser. No. 42,938, Apr. 5, 1993, abandoned.

[30] Foreign Application Priority Data

Apr. 6, 1992 [JP] Japan ................ 4-083509

[51] Int. Cl.⁶ ........................................ H01L 21/265
[52] U.S. Cl. ............................................ 437/47; 437/60
[58] Field of Search ............... 257/276, 277, 528, 531, 257/773; 437/47, 60

[56] References Cited

U.S. PATENT DOCUMENTS

| 4,896,194 | 1/1990 | Suzuki | 257/276 |
| 4,959,705 | 9/1990 | Lemnios et al. | 257/531 |
| 5,268,315 | 12/1993 | Prasad et al. | 437/59 |

FOREIGN PATENT DOCUMENTS

| 0009661 | 1/1987 | Japan | 257/531 |
| 0123455 | 5/1989 | Japan | 257/531 |
| 0067752 | 3/1990 | Japan | 257/531 |
| 0019358 | 1/1991 | Japan | 257/531 |
| 0089548 | 4/1991 | Japan | 257/531 |

OTHER PUBLICATIONS

Chang et al., Large Suspended Inductors on Silicon and Their Use in a 2–μm CMOS RF Amplifier, IEEE Electron Device Letters, vol. 14, No. 5, May 1993, pp. 246–248.

*Primary Examiner*—Brian E. Hearn
*Assistant Examiner*—Michael Russell
*Attorney, Agent, or Firm*—Jordan and Hamburg

[57] ABSTRACT

A method of making a semiconductor device having formed thereon an inductor comprises a silicon substrate. A cut out region is obtained by removing a part of the silicon substrate in a hollow shape which may be a hollow cavity or a hollow cavity with an insulating material having a low complex permittivity such as silicon oxide buried therein. An insulator layer is formed on the cut out region and on the periphery thereof. A connection layer serves as one of the leads of the inductor and is formed using an electric conductive material such as a metal or doped polycrystalline silicon. A contact hole is provided in the interlayer insulation layer. A connection layer serves as an inductor and the other lead of the inductor, which is formed using an electric conductive material such as a metal. A protective insulator layer is also provided on the top of the structure.

13 Claims, 2 Drawing Sheets

METHOD OF MAKING A COMBINED SEMICONDUCTOR DEVICE AND INDUCTOR

This application is a continuation of application Ser. No. 08/042,938, filed Apr. 5, 1993 now abandoned.

FIELD OF THE INVENTION

The present invention relates to a semiconductor device and more particularly to a semiconductor device equipped with an inductor.

BACKGROUND OF THE INVENTION

When an inductor is formed on a semiconductor substrate of a semiconductor device such as a silicon integrated circuit (IC), the supplied energy is consumed as a dielectric loss, eddy current loss, etc., because the complex permittivity of the semiconductor substrate is too large to be neglected.

It has been difficult, accordingly, to provide an inductor on conventional semiconductor devices such as the silicon ICs.

SUMMARY OF THE INVENTION

An object of the present invention is to provide a semiconductor device on which an inductor can be formed.

The semiconductor device according to the present invention comprises a semiconductor substrate, a first region formed by removing a part of the semiconductor substrate to form a hollow shape, an insulator film formed on the main surface side of the semiconductor substrate, and a connection layer on the insulator film on the side thereof opposite to the first region. The connection layer functions as an inductor.

Preferably, the aforementioned first region is a hollow cavity or a hollow cavity containing an insulating material buried therein. The connection layer preferably has a spiral shape. Furthermore, an active element such as a transistor must be formed on the main surface side of the substrate.

BRIEF DESCRIPTION OF THE DRAWINGS

In order that the invention may be more clearly understood, it will now be disclosed in greater detail with reference to the accompanying drawings, wherein.

DESCRIPTION OF THE PREFERRED EMBODIMENTS

Figure 1:
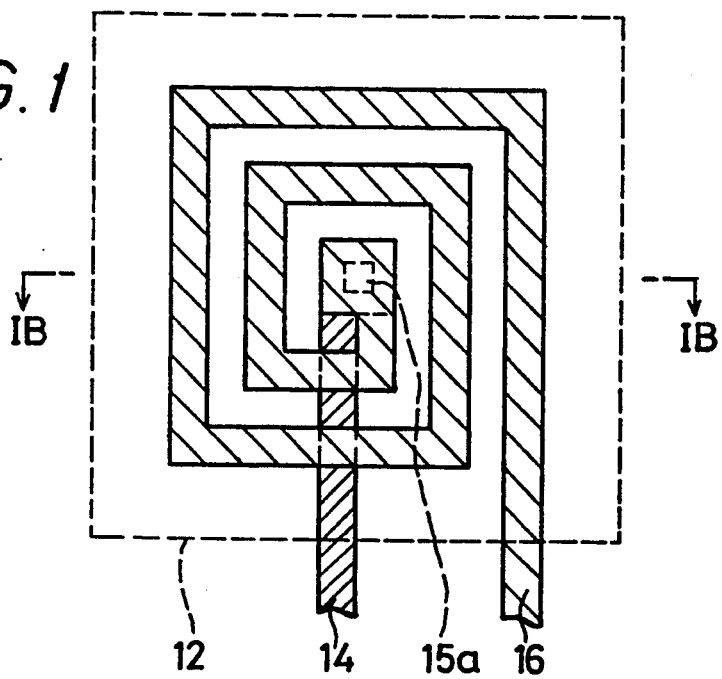
FIGS. 1a and 1b are schematic plan and cross-sectional views, respectively, of a device according to the first example of the invention.
Figure 1:
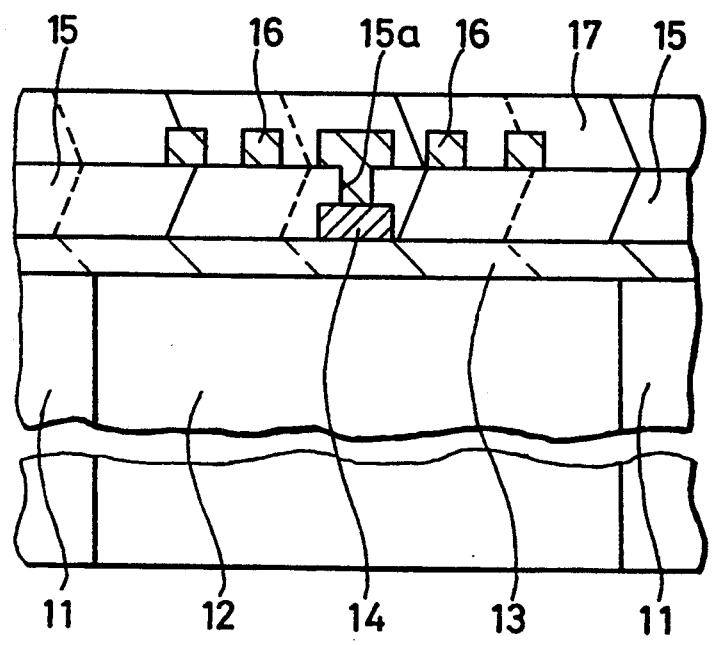

FIG. 1 illustrates a device according to a first embodiment of the present invention. FIG. 1(A) is a schematic view of the planar structure of the device, and FIG. 1(B) is a cross sectional view of the device along the line IB—IB indicated in FIG. 1(A).

A material used in ordinary silicon ICs is utilized for the silicon substrate 11 of the device according to the present invention. A cut out region 12 (first region) is obtained by removing a part of the silicon substrate 11 in a hollow shape, generally with a size (length of the edge) of from about 10 $\mu$m to 1 mm. The cut out region may be a hollow cavity or a hollow cavity having an insulator material buried therein, the insulator material is a material having a low complex permittivity such as silicon oxide. An insulator layer 13 is formed using an insulator material such as silicon nitride over the cut out region 12 and, at the periphery thereof, with a layer of thickness of from several tens to several hundreds of nanometers. A connection layer 14 is provided on the layer 13, and has a thickness of about several hundreds of nanometers. The layer 14 serves as one of the leads, and is established using an electric conductive material including a metal such as molybdenum, aluminum or a doped polycrystalline silicon. An intermediate insulator layer 15 is provided with a thickness of about several hundreds of nm using an insulator material such as silicon oxide, and a contact hole 15a is provided in part thereof to connect the connection layer 14 to another connection layer 16. The layer 16, which has a connection width of from 1 to several tens of micrometers and a thickness of about 1 $\mu$m, is established using an electric conductive material such as a metal, e.g., aluminum, and serves as an inductor and as the other lead of the inductor. The inductor portion is formed in a spiral structure as shown in FIG. 1. A protective insulator layer 17, which is the same as the passivation layer used in an ordinary silicon IC, is also established on the layers 15 and 16.

Referring to FIG. 1, in a process for fabricating a device according to the first embodiment of the present invention, an insulating thin film was deposited on a silicon substrate 11, and was patterned to give a predetermined shape to establish an insulator layer 13. A predetermined electric conductive film was deposited thereon, which was then subjected to patterning to obtain a predetermined connection layer 14. Then, an interlayer insulating layer 15 was formed and patterned to a predetermined shape to establish a contact hole 15a. A predetermined conductive thin film was then deposited and patterned to provide a connection layer 16 having a predetermined shape. The protective insulator layer 17 was then formed. Finally, the silicon substrate 11 was etched from the back side using a predetermined mask pattern to form the cut out region 12. Etching was conducted using, for example, a potassium hydroxide solution or a hydrated hydrazine solution. If an insulator material is to be buried in the cut out region 12, an insulator material such as silicon oxide is incorporated into the hollow cavity using a CVD process or the like.

Figure 2:
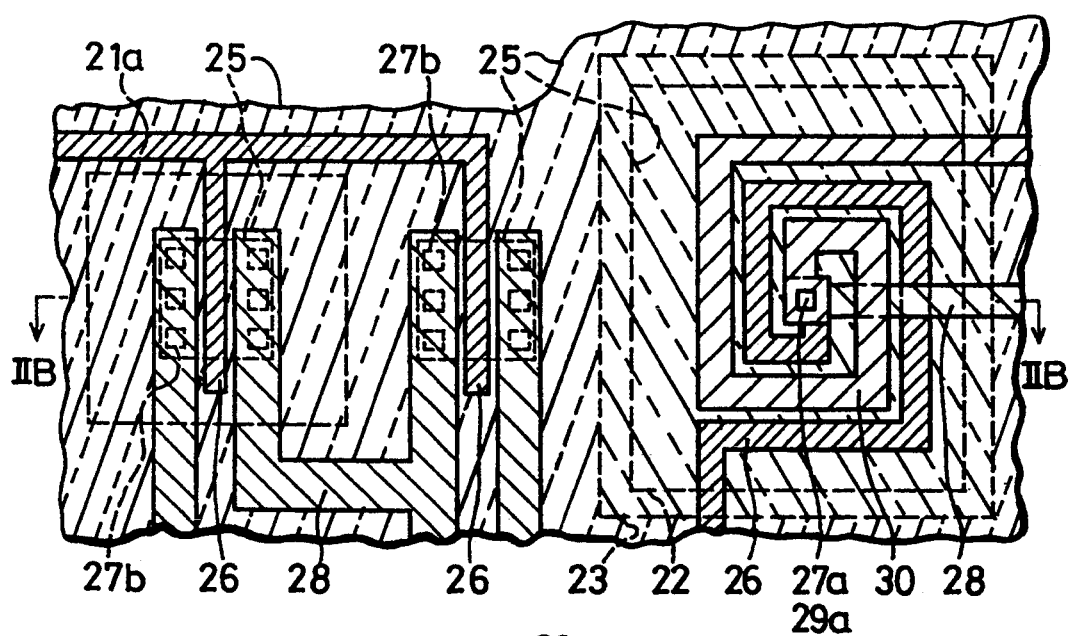
FIGS. 2a and 2b are plan and cross sectional views, respectively, of a device according to the second example of the invention.
Figure 2:
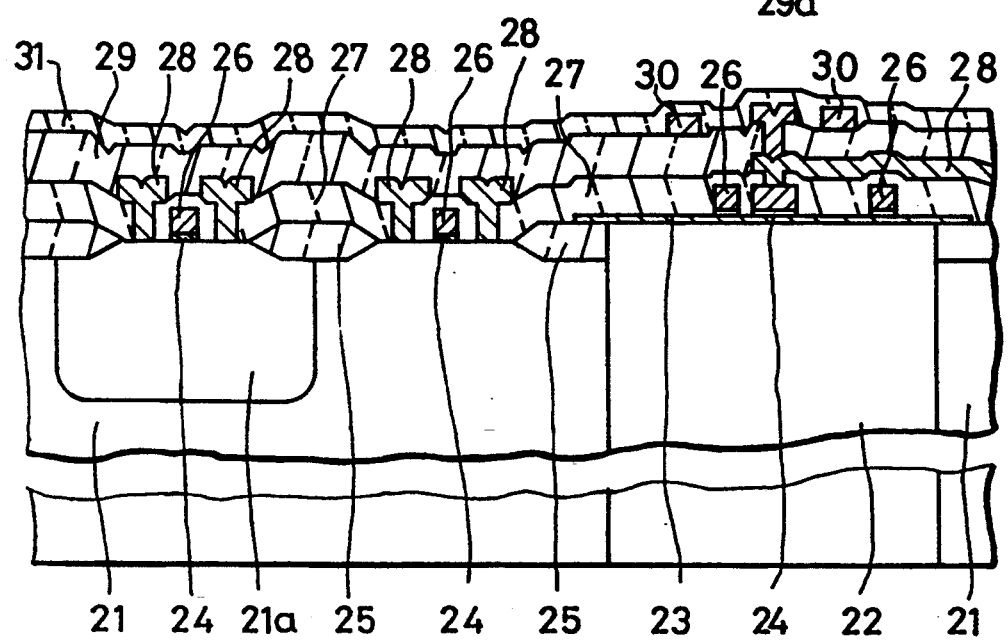

Referring to FIG. 2, a device according to the second embodiment of the present invention is described below. FIG. 2(A) shows schematically the planar structure of the device, and FIG. 2(B) shows the cross section of the device along the line IIB—IIB indicated in FIG. 2(A). The present example refers to a silicon CMOS IC having formed thereon an inductor. More specifically, the left half sides of FIGS. 2(A) and 2(B) correspond to the region for CMOS transistor, and the right half sides of the same figures correspond to the inductor region.

The device comprises a silicon substrate 21, in which a substrate of the type used in ordinary silicon ICs can be used. A well 21a was formed on a part of the substrate. The cut out region 22 (i.e., the first region) was similar to that shown in FIG. 1 as described in example 1. That is, the cut out region 22 may be a hollow cavity or a hollow cavity having an insulator material buried therein. An insulator layer 23 was formed in the same manner as in FIG. 1 of example 1. Accordingly, a detailed explanation therefor is omitted in the present example. A gate insulator layer 24 and a LOCOS-structured field insulator layer 25 are the same as those used in a conventional silicon CMOS IC.

The connection layer 26 serves as a spiral-shaped inductor and a lead therefor in the inductor region, and as a gate electrode and a gate connection in a CMOS transistor region. The connection layer 26 is formed using an electric conductive material such as a metal, e.g., molybdenum and aluminum, and a doped polycrystalline silicon. The interlayer insulation layer 27 is formed using an insulator material such as silicon oxide, and comprises a contact hole 27a formed in the inductor region thereof to connect the connection layer 26 to another connection layer 28. In the CMOS transistor region of the interlayer insulation layer, on the other hand, a contact hole 27b is formed for the source/drain.

The connection layer 28 is established using a conductive material such as a metal (e.g., aluminum). The connection layer 28 functions as a common tap for the inductor and a lead therefor in the inductor region, and as an electrode for the source/drain or an interconnection for the elements in the CMOS region. The interlayer insulation layer 29, made of an insulating material such as silicon oxide, comprises a contact hole 29a formed therein for connecting the connection layer 28 to another connection layer 30.

The connection layer 30 is established using a conductive material such as a metal (e.g., aluminum) to serve as a spiral inductor or a lead thereof in an inductor region, and as a connection (not shown in the Figure) for connecting elements in the CMOS transistor region. The protective insulator layer 31 is the same as a passivation layer used in an ordinary silicon IC.

In the present example, the connection layers 26 and 30 are each formed in a spiral shape and the connection layer 28 is utilized as a common tap. It can be seen that a transformer is formed by this construction. It is also possible to form a transformer using either of the connection layers 26 or 30 to obtain two spiral patterns as shown in the planar view in FIG. 2(A), and using the connection layer 28 as a common tap.

The process for fabricating the device of the present Example can be readily realized by combining the process described in the foregoing Example 1 with an ordinary process for fabricating a silicon CMOS IC. That is, the process is essentially the same as that used in a process of fabricating a conventional silicon CMOS IC, except for the steps of forming the cut out region 22 and the insulator layer 23. Needless to say, each of the connection layers and the like in the inductor region and in the CMOS transistor region can be formed in the same step.

The foregoing description were made of embodiments wherein spiral inductors were formed. Those inductors, however, need not always be in a spiral shape. They may alternatively be other lines, such as microstrip lines, coplanar lines, and slot lines.

The present invention provides a device considerably reduced in, for example, dielectric loss and eddy current loss, because an inductor is provided corresponding to the first region obtained by removing a part of a semiconductor substrate in a hollow shape. Thus, a favorable inductor can be formed.

Although the present invention has been fully described by way of example with reference to the accompanying drawings, it is to be understood that various changes and modifications will be apparent to those skilled in the art. Therefore, unless such changes or modifications depart from the scope of the invention, they should be construed as being included therein.

What I claim is:

1. A process for producing a semiconductor device, comprising the steps of:
   forming a first insulation layer in a given region on a first surface of a semiconductor substrate;
   simultaneously forming:
      a first conductor comprising an inductor extending across a part of said given region of said first insulation layer, and
      a second conductor on said first surface outside of said given region, said second conductor comprising an electrode of an MOS transistor; and
   forming a cavity in a second surface of said semiconductor substrate in alignment with said given region.

2. A process according to claim 1, further including the step of forming a solid insulating material in said cavity.

3. A process according to claim 1, wherein said electrode comprises a gate electrode of an MOS transistor.

4. A process according to claim 1, wherein said step of forming said first conductor includes the step of forming said first conductor in a spiral pattern.

5. A process for producing a semiconductor device, comprising the steps of:
   forming a first insulation layer in a given region on a first surface of a semiconductor substrate;
   simultaneously forming:
      a first conductor comprising an inductor extending across a part of said given region of said first insulation layer, and
      a second conductor on said first surface outside of said given region, said second conductor comprising an electrode of an MOS transistor; and
   forming a second insulation layer over said first insulation layer, said first conductor, said second conductor and said substrate not covered by said first insulation layer, such that a contact hole is formed in said second insulation layer above said first conductor;
   forming a connection layer on said second insulation layer and in said contact hole for contacting said first conductor;
   forming a cavity in a second surface of said semiconductor substrate in alignment with said given region.

6. A process according to claim 5, further including the step of forming a solid insulating material in said cavity.

7. A process according to claim 5, wherein said electrode comprises a gate electrode of an MOS transistor.

8. A process according to claim 5, wherein said step of forming said first conductor includes the step of forming said first conductor in a spiral pattern.

9. A process for producing a semiconductor device, comprising the steps of:
   forming a first insulation layer in a given region on a first surface of a semiconductor substrate;
   simultaneously forming:
      a first conductor comprising an inductor extending across a part of said given region of said first insulation layer, and
      a second conductor on said first surface outside of said given region, said second conductor comprising an electrode of an MOS transistor; and forming a second insulation layer over said first insulation layer, said first conductor, said second conductor and said substrate not covered by said first insulation layer, such that a first contact hole is formed in said second insulation layer above said first conductor;

forming a first connection layer on said second insulation layer and in said first contact hole for contacting said first conductor;

forming a third insulation layer over said second insulation layer and said connection layer, such that a second contact hole is formed in said third insulation layer above said connection layer;

forming a second connection layer on said third insulation layer and in said second contact hole for contacting said first connection layer; and forming a cavity in a second surface of said semiconductor substrate in alignment with said given region.

10. A process according to claim 9, further including the step of forming a solid insulating material in said cavity.

11. A process according to claim 9, wherein said electrode comprises a gate electrode of an MOS transistor.

12. A process according to claim 9, wherein said step of forming said first conductor includes the step of forming said first conductor in a spiral pattern.

13. A process according to claim 9, wherein said step of forming said second connection layer includes the step of forming said second connection layer in a spiral pattern.

* * * * *